United States Patent
Hackler, Sr. et al.

(10) Patent No.: US 8,072,006 B1
(45) Date of Patent: Dec. 6, 2011

(54) DOUBLE-GATED SENSOR CELL

(75) Inventors: Douglas R. Hackler, Sr., Boise, ID (US); Richard A. Hayhurst, Nampa, ID (US); Stephen A. Parke, Nampa, ID (US)

(73) Assignee: American Semiconductor, Inc., Boise, ID (US)

( * ) Notice: Subject to any disclaimer, the term of this patent is extended or adjusted under 35 U.S.C. 154(b) by 261 days.

(21) Appl. No.: 11/306,292

(22) Filed: Dec. 21, 2005

(51) Int. Cl.
*H01L 29/76* (2006.01)

(52) U.S. Cl. ......... 257/226; 257/225; 257/23; 257/347; 257/365; 257/366

(58) Field of Classification Search .................. 257/226, 257/225, 233, 347, 365, 366
See application file for complete search history.

(56) References Cited

U.S. PATENT DOCUMENTS

| | | | |
|---|---|---|---|
| 4,954,895 A | 9/1990 | Akimoto et al. | |
| 5,873,003 A | 2/1999 | Inoue et al. | |
| 6,127,701 A | 10/2000 | Disney | |
| 6,380,572 B1 | 4/2002 | Pain et al. | |
| 6,838,301 B2 | 1/2005 | Zheng et al. | |
| 2004/0056305 A1* | 3/2004 | Segura et al. | 257/341 |
| 2005/0001319 A1 | 1/2005 | Hackler et al. | |

FOREIGN PATENT DOCUMENTS

JP 2001332715 A * 11/2001

OTHER PUBLICATIONS

Tanaka et al, "Ultrafast Operation of Vth—Adjusted p+-n+ Double-Gate SOI MOSFETs", IEEE Electron Device Letters, vol. 15, No. 10, Oct. 1994.*

* cited by examiner

*Primary Examiner* — Eugene Lee
(74) *Attorney, Agent, or Firm* — Your Intellectual Property Matters, LLC; Robert A. Frohwerk

(57) ABSTRACT

A high quality imager is constructed using a silicon-on-insulator (SOI) process with sensors fabricated in the SOI substrate and isolated by the buried oxide (BOX) from associated readout circuitry in the SOI layer. Handle windows are opened in the SOI device layer for fabrication of the sensors in the handle layer substrate and then closed prior to processing in the device layer. By keeping the buried oxide layer intact, the described technique allows for independent processing of sensors and readout circuitry so that each is optimized with regard to thermal and dopant properties without concern for degradation of the other. The process is compatible with the fabrication of readout circuitry using transistors having independent double-gates, which offer simultaneous advantages in scalability, low power and low noise. Photodiode sensors are shown with allowance for many other types of sensors. The process easily accommodates hardening against radiation.

20 Claims, 8 Drawing Sheets

DOUBLE-GATED SENSOR CELL

CROSS-REFERENCES TO RELATED APPLICATIONS

U.S. patent application Ser. No. 10/613,169 filed Jul. 3, 2003, entitled "Multi-Configurable Independently Double-Gated MOSFET," is incorporated here by reference.

FIELD OF THE INVENTION

The present invention relates generally to the composition and manufacture of imagers and, more specifically, to a monolithic silicon-on-insulator (SOI) CMOS imager, wherein the sensing element is implemented in the substrate.

BACKGROUND OF THE INVENTION

As complementary metal-oxide-semiconductor (CMOS) technology has developed, it has become the technology of choice for integrated circuitry due to its capability to produce low-cost, low-power, reliable and highly integrated systems. Ever-increasing device densities have been driven by demand for ever-increasingly capable consumer products that require more and more memory to support ever more complex circuitry for process and control systems. One of the more recent applications to be effectively addressed by CMOS technology has been that of imaging. This has been accomplished by the development of active pixel detectors which incorporate the transistors of the readout electronics into the same device cell as the sensor itself.

Unfortunately, imagers with photodiodes and CMOS integrated on a single semiconductor substrate, or wafer, are difficult to manufacture. The photodiode and the CMOS can each interfere with the other and limit overall performance. When a viable compromise in performance is achieved in a monolithic photodiode with CMOS imager, there is the opportunity to scale it to smaller feature size consistent with industry standard technology migration. This yields the required economic competitiveness and performance improvement but scaling is limited by an accompanying reduction in voltage range and an increase in noise level. Thus, it would be an advancement in the art to provide a monolithic sensor cell that—
    integrates photodiodes and CMOS without compromising the performance of either component,
    reduces the voltage limitations associated with scaling,
    improves the noise performance, and
    implements efficient fabrication techniques.

Some early attempts to produce integrated CMOS-based imagers used a bulk-CMOS technology in which reverse-biased photodiodes formed by the n+/p– substrate junction relied upon a portion of the substrate as a collection region. For a while, this conveniently allowed arrays of photodiodes to scale downward in size as CMOS densities increased. This was a workable technique as long as the device dimensions and corresponding collection regions were somewhat larger than the wavelengths of the photons being detected. However, for detectors in the visible region of 400-800 nanometers (nm), the collection efficiency dropped off and crosstalk between cells increased as CMOS dimensions dropped below about 0.5 µm.

The advent of Silicon-on-Insulator (SOI) and its application to CMOS technologies has presented alternatives to bulk-CMOS. In SOI, transistors are created on a thin top silicon layer that is separated from a silicon substrate by a thin insulating layer of glass or silicon dioxide. Standard SOI substrates are constructed by one of two processes. In the first of the two processes, known as SIMOX (for Separation by IMplantation of OXygen), oxygen is ion-implanted into a polished wafer under intense heat after which the wafer is annealed in high temperature to form a buried oxygen layer, commonly known as the BOX, at a uniform depth from the surface while eliminating defects made in the surface layer. In the second of the two processes, a "Bonded" SOI wafer is produced by bonding of a thin device wafer onto a thicker one known as a handle wafer utilizing for adhesion the common oxide that becomes the BOX. Both processes result in the same three-layer substrate structure. The result of either process is an SOI wafer having a thicker base substrate, or handle layer, on top of which is a buried oxide layer which in turn is covered by the thinner SOI layer. Thicknesses of the layers for present production technologies are about 0.1-1 µm for the SOI layer, 0.1-1 µm for the BOX, and 750 µm for the handle layer.

With the buried oxide layer providing isolation between the SOI layer and the substrate, devices built in the SOI layer experience reduced substrate capacitance which contributes to lower power requirements while increasing transistor switching speed. Also, the $I_O$ versus $V_G$ characteristics of such devices have steeper slopes below $V_t$ than conventional bulk-CMOS devices, thus reducing leakage current when devices are in their off-states without the need to increase threshold voltages.

As attractive as SOI-CMOS device characteristics may be for imagers, the use of this technology for such an application is not without its drawbacks. A temptation to construct photodetectors in the SOI layer is met with the recognition that the thin silicon film lacks sufficient thickness to efficiently absorb photons of visible light. For detection of light having a wavelength of 800 nm, for instance, the quantum efficiency of a 0.5 µm thick silicon film is only about 5%, whereas a film having a thickness of 16 µm or greater is required to achieve a more desirable quantum efficiency of 80%. This suggests that a more desirable solution would be to form the detectors in the thicker handle layer, while preserving the SOI layer for the readout circuitry. Earlier versions of this approach have been described by others.

The formation of photodiodes in a silicon substrate with MOS transistors built in the thin silicon-on-insulator layer has been described by Akimoto, et al. in U.S. Pat. No. 4,954,895. In their design a photodiode which was formed in the substrate also served as the source terminal of a vertical MOS transistor switch, the gate and drain of which were formed on the silicon substrate. These in turn were connected to horizontal MOS transistors in an SOI structure formed on an insulating oxide film for the remainder of the readout circuitry.

Pain and Zheng as co-inventors in U.S. Pat. Nos. 6,380,572 (to Pain, et al.) and 6,838,301 (to Zheng, et al.) described the formation of silicon islands on top of the buried oxide layer on the substrate. The BOX was then etched away to provide access for formation of the photodetector. In this manner processing of the photodetector could be accomplished simultaneously with implementation of the drain and source of the first MOS device at the input of the readout circuitry in the SOI layer.

An approach related to the above-described techniques is developed by Kucewicz, et al. in a paper entitled "Development of monolithic active pixel detector in SOI technology" (Nuclear Instruments and Methods in Physics Research Section A, Volume 541, Issues 1-2, 1 Apr. 2005, Pages 172-177). Unlike others who have aimed specifically at photo detection, the focus of Kucewicz, et al. is to develop sensors for ionizing radiation such as that from a Strontium-90 (Sr-90) radioactive source. Their preference is to use wafer-bonded substrates, rather than other popular SOI substrates obtained in the SIMOX process, due to what they identify as the lower level of structural defects in both device and support layer and the absence of silicon inclusions and islands in the buried oxide. Otherwise, their approach is very similar to those that have been described above. Their particle detecting sensor, having a depth of 300 micrometers, is realized in the support layer with its high-resistivity (44 k Ohm/cm) and has a conventional form of a matrix of p+-n junctions. The readout electronics is fabricated in the 1.5 µm thick, low-resistive device layer and monolithically coupled to the detector by a connection that passes through the buried oxide.

One feature that is common to all of the above described implementations is that both the SOI and buried oxide (BOX) layers are etched away to open a window in which to build the sensor in the handle layer, with the readout electronics in the SOI layer. The present invention, to be described here, is unique in that it utilizes a process that does not etch but maintains the integrity of the BOX. This new method provides the advantages of isolation between the components fabricated in each of the two layers and protection of the surface of the photodiode from damage or contamination. This process invention also provides for re-planarization of the silicon surface prior to CMOS processing. Furthermore, the high temperature processing desired for construction of photodiodes is completed prior to the CMOS processing, thereby permitting nanoscale CMOS to be integrated with the photodiodes.

Another significant advantage of the process used in the present invention is that it is fully compatible with the Flexfet™ process developed and owned by American Semiconductor Incorporated and described by Hackler, et al. in U.S. patent application Ser. No. 10/613,169, which will be referred to as the '169 application. The addition of only two minor divergences from the Flexfet™ process allows the readout electronics of the present invention to take full advantage of the Flexfet™ devices produced in that process. Thus, in accord with the stated objectives, an efficient fabrication technique integrates photodiodes and CMOS without compromising the performance of either component. The process used to develop the sensor is completely decoupled from the CMOS process.

Furthermore, the resulting monolithic sensor cell of the present invention makes full use of unique double-gated Flexfet™ transistors in the readout circuitry to reduce the voltage limitations associated with scaling while at the same time improving noise performance over previous designs. The present invention therefore meets the above-itemized goals, achieving performance that is superior to previous designs through techniques that will now be described and claimed herein.

BRIEF SUMMARY OF THE INVENTION

The presently disclosed invention provides a monolithic sensor cell that is scalable with advances in CMOS technologies without the normally associated degradation in dynamic range, noise and leakage current. The process by which the presently described sensor cell is fabricated corresponds to that described by the '169 application with the need for only two additional steps.

Beginning with a standard silicon-on-insulator (SOI) wafer, a photodiode is formed in the handle layer using whatever high thermal budget is necessary prior to fabrication of the CMOS readout circuitry in the thin film SOI layer. A Handle Window (HW) is cut in the SOI layer down to, but not into, the buried oxide (BOX) layer. Formation of the photodiode is accomplished by appropriate implantation steps through the exposed BOX in the Handle Window. The Handle Window is then closed with a material such as TEOS (Tetraethylorthosilicate). Independent Double-Gate CMOS (IDG-CMOS) readout circuitry elements are formed in the SOI layer outside of the Handle Window with a low thermal budget CMOS process after the diode formation. The photodiode pixel sensors in the handle are fully isolated by the BOX from the DG-CMOS SOI layer. This allows for different materials to be used such as p-type for SOI and n-type for diodes. Other material combinations are also possible using current and future wafer substrate bonding techniques. The isolation also mitigates the unfavorable interaction of coupling noise between the diodes and the IDG-CMOS to allow for maximized performance of each.

As CMOS processes scale, voltage also scales, so that threshold voltage requires an increasingly larger portion of the voltage range in order to turn transistors on and off. This causes a reduction of dynamic range. Also, reduced threshold voltages result in high leakage currents that do not meet the requirements of a high-quality imager. Increased threshold voltages reduce the leakage problem, but utilize so much of the voltage range that analog circuit performance is compromised. The use of double-gated transistors in the monolithic sensor cell enables the second, independent, gate to be used to dynamically adjust threshold voltage. This allows high threshold when the device is static so that concern of leakage is eliminated. The transistor may then be dynamically adjusted to zero threshold when the circuit is active, thereby providing the full dynamic voltage range for analog performance.

Further noise reduction is accomplished in the presently described sensor cell by the use of double-gated JFETs, MESFETs, accumulation mode MOSFETs, such as Flexfet™ devices, or buried channel MOSFETs. Any of these devices can be used to reduce the noise that commonly occurs in analog applications at the interface between dielectrics and semiconductors.

The sensor cell produced in accordance with the present invention builds upon the extreme isolation offered by separation of the sensor and readout circuitry into layers on opposite sides of a buried oxide. By using independent-double-gated transistors as readout elements, low power and low noise can be achieved in a single architecture. Other advantages of this invention will be apparent from the following detailed description of preferred embodiments with reference to the accompanying drawings.

BRIEF DESCRIPTION OF THE DRAWINGS

The particular features and advantages of the invention as well as other objects will become apparent from the following description taken in conjunction with the accompanying drawings, in which.

The following Reference Numbers may be used in conjunction with one or more of the accompanying FIGS. 1-15 of the drawings:

10 Photodiode Detector
12 Capacitance
14 Reset Control Signal
15 Reset Switch
16 Bias Voltage Source for Reset Switch
20 Buffer Switch
22 Bias Voltage Source for Buffer Switch
25 Passgate transistor
26 Bias Voltage Source for Passgate
28 Word-line or Row Line
29 Bit-line or Column Line
30 Independent Double-Gate n-channel MOSFET with n-channel JFET schematic representation
40 Wafer Start
42 Standard Flexfet™ Zero Layer
43 Deviation from Standard Flexfet™ Process for Photodiode
44 Standard Flexfet™ Front End to M0
45 Deviation from Standard Process for Interconnect thru Handle Window
46 Standard Flexfet™ M0 through BEOL
48 Finish
50 Photo Diode Formation Option
52 Photo Diode M0 Option
60 Handle Silicon
62 P Pinning Implant
64 Cathode Implant
66 Optional Field Shaping Implant
68 Anode Implant
70 BOX
80 SOI Layer
82 Handle Window
90 n+ Regions for Flexfet™ CMOS
92 p+ Regions for Flexfet™ CMOS
94 Nitride Pad
102 Photo Resist, Pinning Implant
104 Photo Resist, Cathode
106 Photo Resist, Field Shaping
108 Photo Resist, Anode
110 Window Fill (TEOS)
112 Nitride Polish Stop Layer
120 Bottom Gate, p+
122 Bottom Gate, n+
124 Top Gate
130 Nitride
132 Contact Pad, Cathode of Photodiode
134 Contact Pad, Anode of Photodiode
136 Contact Pads, Source and Drain
200 Sensor Cell
210 Photodiode
220 Readout Circuitry

DETAILED DESCRIPTION OF THE INVENTION

The sensor cell of the present invention takes advantage of silicon-on-insulator (SOI) wafers by fabricating devices in both the handle layer and the SOI layer using methods that allow for optimal processing of components in both layers. Extreme isolation between the layers is achieved by maintaining the integrity of the intervening buried oxide (BOX) layer. Special double-gated (DG) transistors are used in the readout circuitry to enhance performance of the sensor cell by reduction of leakage currents, power and noise levels without sacrificing imaging speed. These features and more will be identified in detail through reference to the figures.

Figure 1:
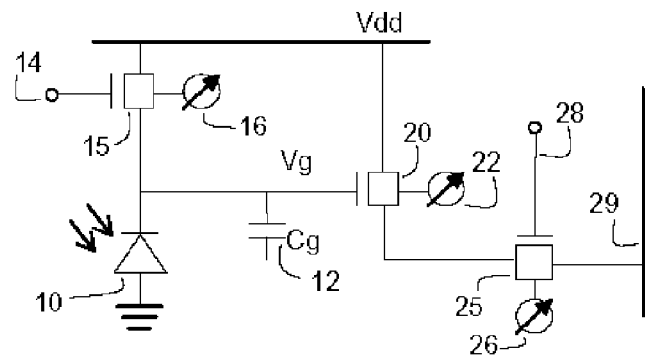
FIG. 1 is a schematic diagram of a three transistor (3T) sensor cell using independent-double-gate (IDG) transistors under the present invention.

The schematic diagram of FIG. 1 depicts a commonly used three transistor sensor cell. In the present invention three SOI transistors 15, 20, and 25 provide the respective functions of resetting, buffering and selecting an individual cell within the imager. In the preferred embodiment of the present invention detector 10 is a photodiode, however, throughout the description that follows here it will be recognized by those skilled in the art that many other types of sensors may be substituted for detector 10. The reset switch 15 resets the voltage on detector 10 to the power supply voltage VDD in response to a reset control signal 14 at its gate. This charges the capacitance 12 at the gate of the source follower 20. When the reset control signal 14 is released, light incident to the photodiode detector 10 will allow the charge on capacitance 12 to discharge to a level in proportion to the intensity of the detected radiation. The source follower connected as buffer switch 20 acts to isolate the voltage developed on the detector 10 from the output stage. After suitable sensing time has elapsed from a reset input 14, passgate transistor 25 will be turned on in order to transfer the output of the buffer switch 20 to the output bus 29.

Figure 2:
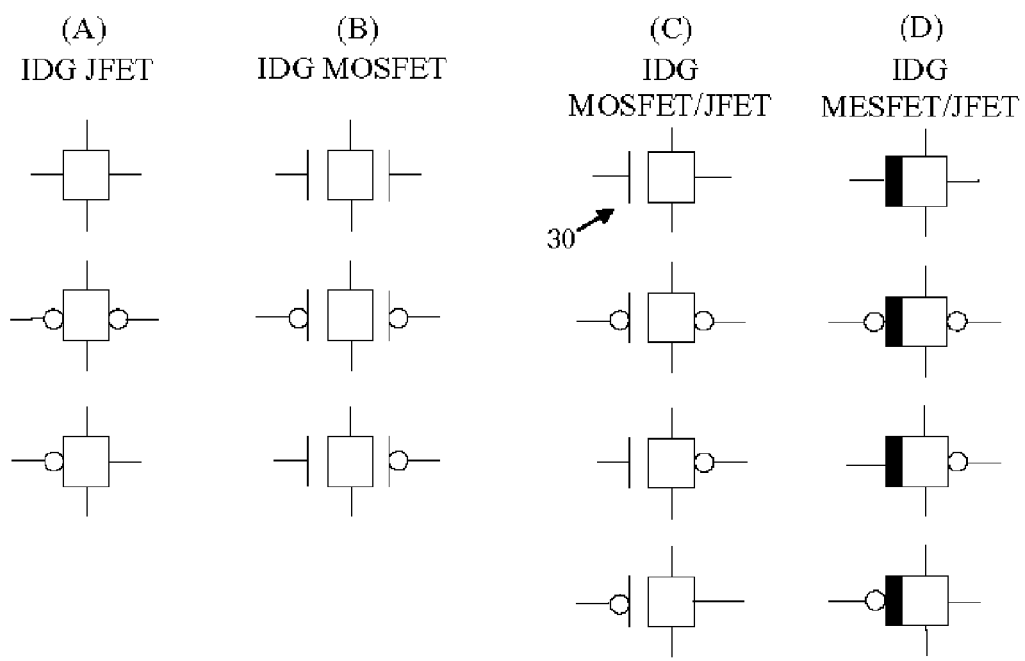
FIG. 2 shows schematic notations for various IDG transistor configurations that can be used to implement the sensor cell of the present invention.

All three transistors of FIG. 1 are depicted as independent-double-gate (IDG) field effect transistors (FETs). Less common than double-gate (DG) FETs, those having independent-double-gates may be produced in a variety of configurations as shown in FIG. 2. Column (A) of FIG. 2 shows, from top to bottom, the three possible configurations of junction FETs (JFETs) having dual independent n-channels, dual p-channels, or one of each p-channel and n-channel. In column (B) of FIG. 2 are shown configurations of IDG-FETs implemented as metal-oxide-semiconductor field effect transistors (MOSFETs) in correspondence channel-wise to the JFETs of column (A). Column (C) of FIG. 2 depicts the four possible configurations of IDG-FETs having one each of MOS-gate and junction-gate, while column (D) of FIG. 2 similarly shows the four possible configurations of IDG-FETs that can be created by the merger of one each of MESFET (Metal Semiconductor FET) and JFET. Of the fourteen configurations of IDG-FETs shown in FIG. 2 it is the top transistor 30 of column (C), namely, the n-channel MOSFET with n-channel JFET that has been selected for use in the readout circuitry of the preferred embodiment of the present invention. The JFET portion of the transistor 30 is chosen to reduce noise. On the MOSFET side, accumulation mode devices are used to reduce noise, since standard depletion mode MOSFETs will not support the intended noise advantages proposed with low noise transistors.

Multiple designs exist for double-gated FETs, and many of them may be used in the circuit topology of FIG. 1. However, the truly independent double-gate FET known by its trade name as the Flexfet™ transistor which was described in the '169 application is the transistor of choice in the preferred embodiment of the presently invented sensor cell. Due to the device topology of a double-gated transistor as it is formed on a wafer, it is convenient to refer to the two gates as bottomgate and topgate. A conventional single-gate transistor having only a topgate effectively has its bottomgate tied to its source terminal. Most double-gated transistors have their bottomgate and topgate tied together. It is only the truly Independent Double-Gate transistor that allows the bottomgate to be tied to a control line independent of the connection made to the topgate.

As depicted in the schematic diagram of FIG. 1, each of the three transistors 15, and 25 is implemented as an independent-double-gate transistor of the type shown in FIG. 2 as transistor 30. A major benefit derived from such implementation is that each of the IDG transistors can be dynamically tuned to optimize them for standby power as well as active performance. In each instance the MOS topgate of the IDG transistor is used in a conventional manner as a single gated MOSFET would be used. However, the use of independent-double-gate transistors allows the bottomgate of each device to be independently biased for optimum control of transistor behavior. While dynamic biasing of threshold voltage is a known circuit technique, independent double-gates are required in order to enable complementary biasing. In each of the three cases here the junction-type bottomgates are biased to control the channel characteristics that will be presented to the MOS-type topgate.

The transistor used as the reset switch 15 is biased at its bottomgate by voltage source 16 so that there is effectively no threshold voltage drop across the reset switch 15. This allows the voltage on the photodiode 10 to be fully reset to VDD in order to present an improved maximum dynamic headroom to the topgate of buffer switch 20. By appropriate setting of the bias voltage sources 22 and 26 on the buffer switch 20 and the output passgate 25, respectively, both transistors can be placed into a high-speed mode where higher drive current is available. When a particular sensor cell is not called upon to be active, the bias voltage sources 22 and 26 may be set so as to place their respective buffer and output switches 20 and 25 into a standby mode in which they will exhibit low leakage current as well as low temperature sensitivity. The independent double-gate of passgate 25 allows for the avoidance of threshold voltage (V.sub.t) loss and improves the dynamic range headroom of that circuit element.

Figure 3:
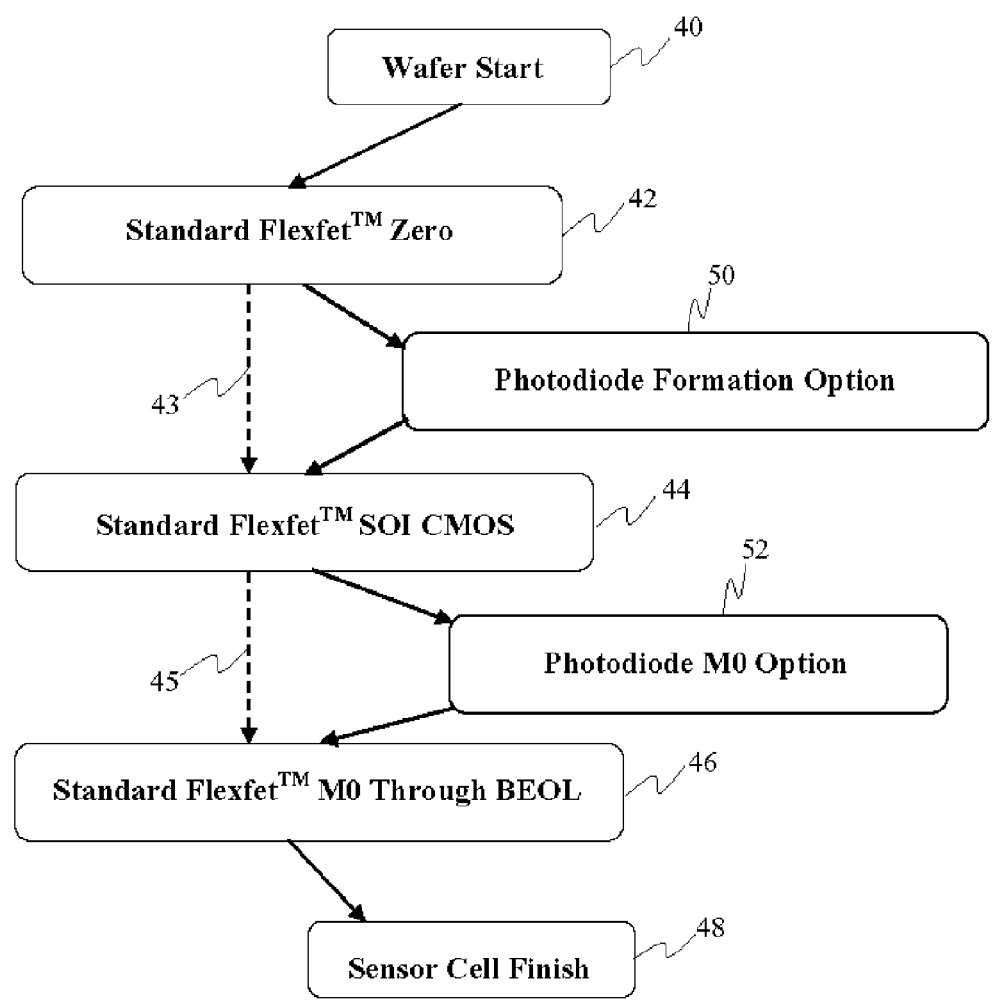
FIG. 3 is a process flow diagram of the standard Flexfet™ process with the inclusion of a photodiode formation option.
Figure 4:
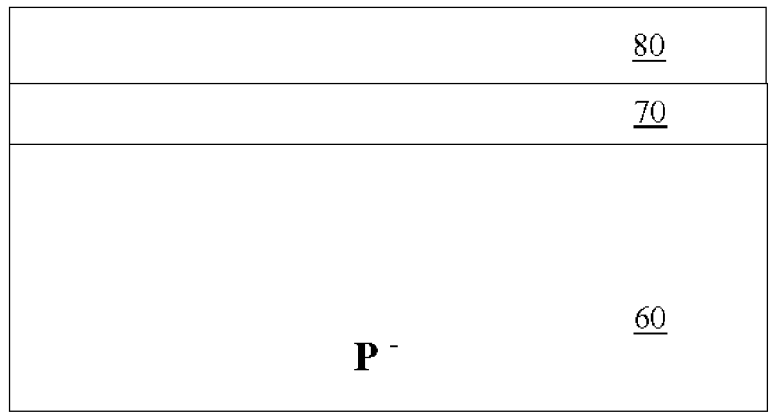
FIG. 4 is a cross-sectional view of the layers of a standard SOI substrate as the starting material for an sensor cell of the present invention.

Construction of the sensor cell begins with any of the standard SOI substrates, as shown in the cross-sectional view of FIG. 4, whether they have been produced by the SIMOX process or Bonded. Conveniently, this is the same three-layer material that is used at Wafer Start 40 of FIG. 3 for the manufacture of Flexfet™ SOI CMOS devices though many of the techniques described here may be adapted to other processes and materials as well. Typically, the thicker layer at the bottom, or back surface, of the wafer is the Handle Layer 60. Above the Handle Layer 60 is the Buried Oxide Layer 70, or BOX, which in turn is covered with the Device Layer, also referred to as the SOI Layer 80, which faces the top or front surface of the wafer. Traditional processes utilize only the SOI Layer 80 for the fabrication of CMOS and imager devices, relegating the role of the Handle Layer 60 solely to that of structural support. The present invention, however, goes beyond traditional processing to place the sensors in the Handle Layer 60.

Fabrication of the sensors in the Handle Layer 60 separated from the readout circuitry in the SOI layer 80 offers significant advantages. In addition to the operational isolation of the sensor provided by the BOX 70, the physical separation provides even more benefits. Placing the sensors in a physically separate layer allows them to be fabricated with an optimized process that may use a temperature profile and dopant and material characteristics that are totally different from those used for fabrication in the Device Layer 80.

Figure 5:
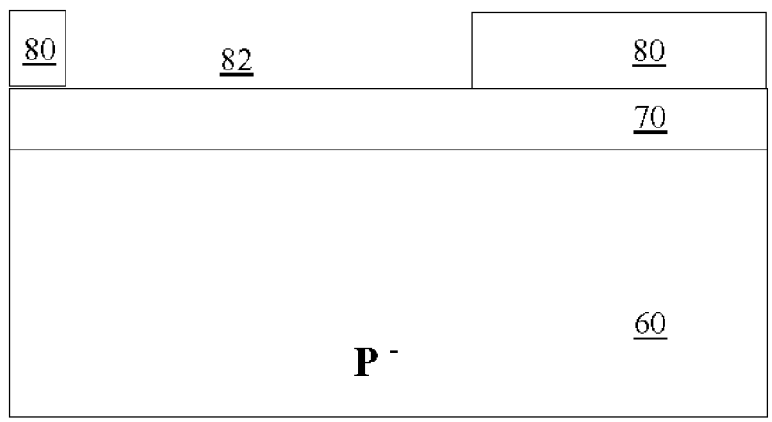
FIG. 5 is a cross-sectional view of the standard SOI substrate of FIG. 4 following removal of the SOI layer to create a Handle Window.

To take advantage of this feature, fabrication of the imager of the present invention begins with the sensors. By processing the sensors first, they may be fabricated with as many high temperature steps as are needed without regard for the more sensitive low temperature processes that will typically be used for CMOS devices in the SOI layer 80. Following some standard pre-processing shown as step 42 in FIG. 3, the process flow is augmented to include the development of the sensor in Photodiode Formation Option 50. The first step in this special processing, shown in FIG. 5, is to open a window, referred to as a Handle Window 82, in the SOI layer 80 using methods known in the art, such as masking and etching. Here, the presently described process deviates from methods used previously by others in that this step stops at the BOX 70, leaving the insulator intact.

Figure 6:
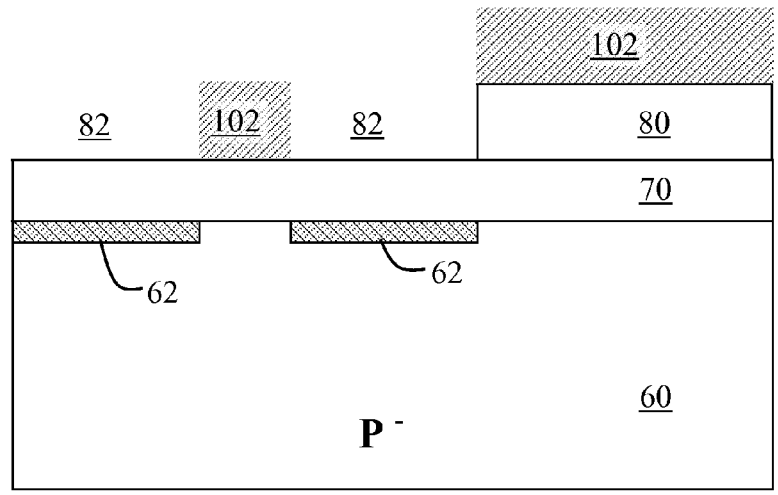
FIG. 6 is a cross-sectional view showing the formation of a Pinning Implant in the Handle Layer below the buried oxide that has been exposed by a Handle Window from FIG. 5 with optional photo resist.

The Handle Window 82 is then used as a screen through which fabrication of a variety of diodes, standard or custom, or other sensors may be accommodated. FIG. 6 shows the first step in the formation of a photodiode as used in the preferred embodiment. Pinning implants 62 are installed in the substrate 60 below the Handle Window opening 82 to passivate traps at the Si—SiO.sub.2 interface between the underside of the BOX 70 and the substrate 60. This pinning of the surface potential to the substrate potential will preserve the field structure around the electrodes.

Figure 7:
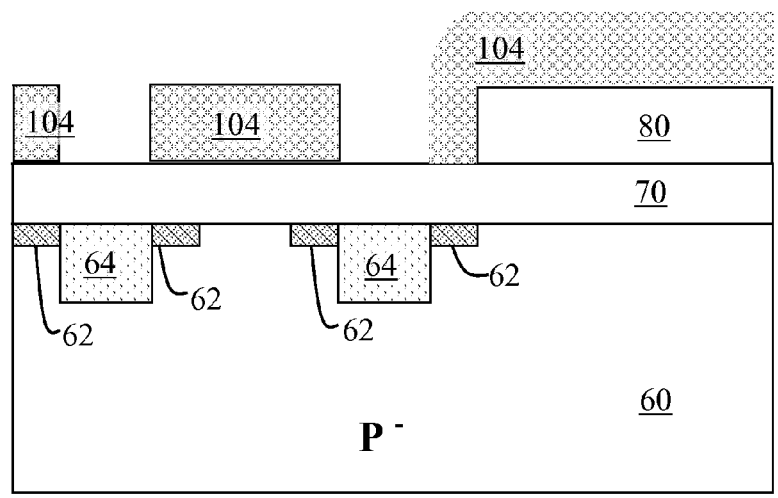
FIG. 7 is a cross-sectional view showing the sensor cell of FIG. 6 following implantation of photodiode cathodes.
Figure 8:
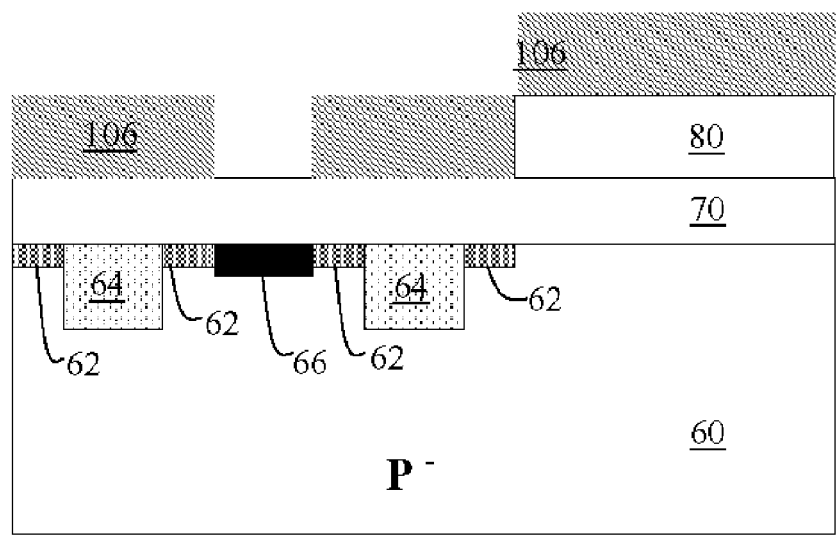
FIG. 8 is a cross-sectional view of the sensor cell of FIG. 7 after optional field shaping implants.
Figure 9:
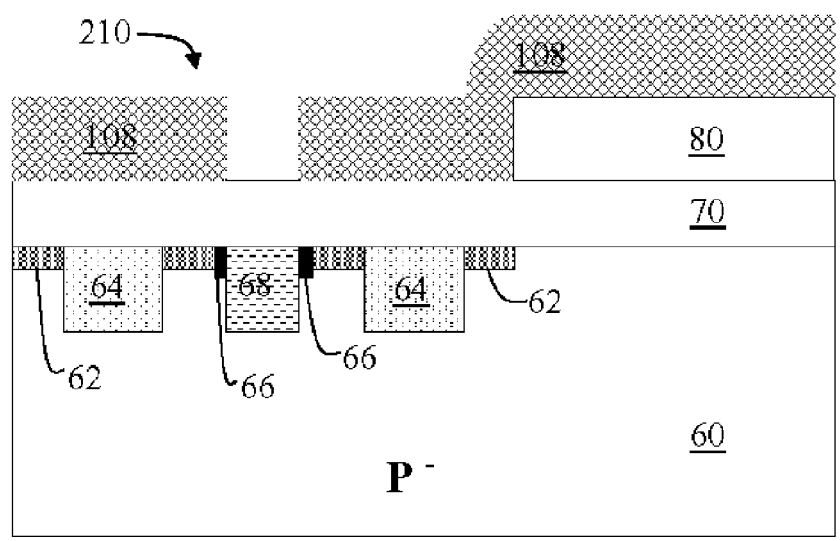
FIG. 9 is a cross-sectional view of the sensor cell of FIG. 8 following formation of anodes to complete the photodiode.

The next step in the fabrication of the photodiode is to mask with photo resist 104 for implantation of the cathode 64 as shown in FIG. 7, after which an optional annealing may take place. To better control the collection of photons, an optional field shaping implant 66 may be installed through photo resist 106 as shown in FIG. 8. This is followed in FIG. 9 by photo resist 108 for the formation of the anode 68 to complete the photodiode 210

Fabrication of the sensors in the described manner, that is, through the intact BOX 70, improves the quality of the photodiode junctions by reducing damage to the silicon crystal of the Handle Layer 60. One expected result is reduced leakage current, or dark current, of the photodetector.

The buried oxide layer 70 remains intact throughout the processing of the photodiodes 210 which are fabricated to completion prior to any development within the SOI layer 80. This allows the use of as many high temperature steps as are needed to produce high-quality photodiodes, or other types of sensors, optimizing the process to meet any special requirements without regard for the temperature-sensitive CMOS that will be installed later.

Figure 10:
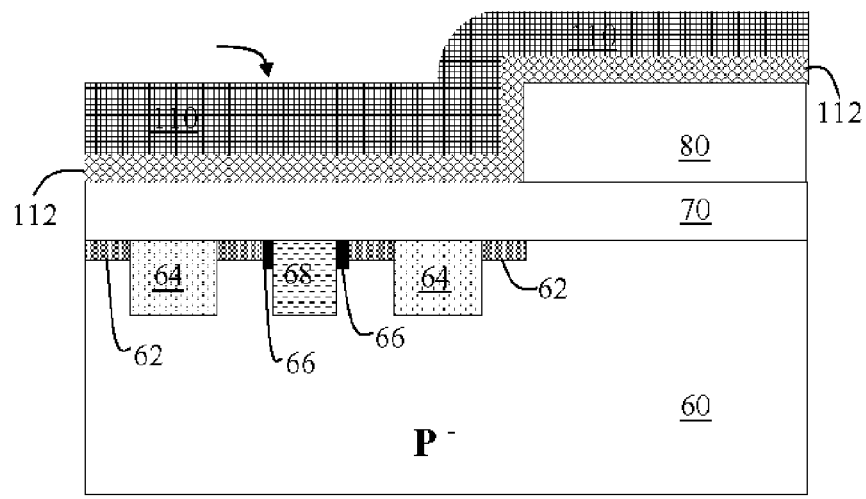
FIG. 10 is a cross-sectional view of the sensor cell of FIG. 9 after the Handle Window has been filled.
Figure 11:
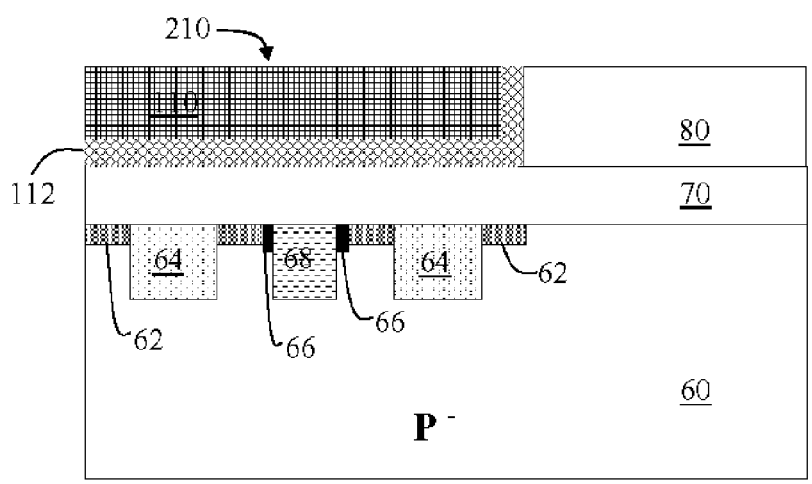
FIG. 11 is a cross-sectional view of the sensor cell of FIG. 10 after the SOI layer has been opened for processing of devices within it.

Processing of the sensors continues in FIG. 10 where the Handle Window 82 is filled with an insulating material 110.

One common filler material is PE-CVD (Plasma-Enhanced Chemical Vapor Deposited) Oxide TEOS, which is used in the preferred embodiment of the present invention, though any one of many similar materials known to those skilled in the art may be substituted. Following the sealing of the Handle Window 82, the device is planarized by CMP (Chemical Mechanical Planarization) or etch-back techniques, resulting in the configuration shown in FIG. 11. If an optional CMP layer of nitride is placed under the TEOS as a polish stop 112 to protect the SOI layer from damage during polishing, it must be removed after the TEOS polishing. The planarization step makes the SOI layer 80 available for processing of thin-film transistor (TFT) circuitry such as the Flexfet™ CMOS devices used in the preferred embodiment. Planarization of the surface serves to simplify subsequent CMOS processing and to improve the density of interconnects.

Figure 12:
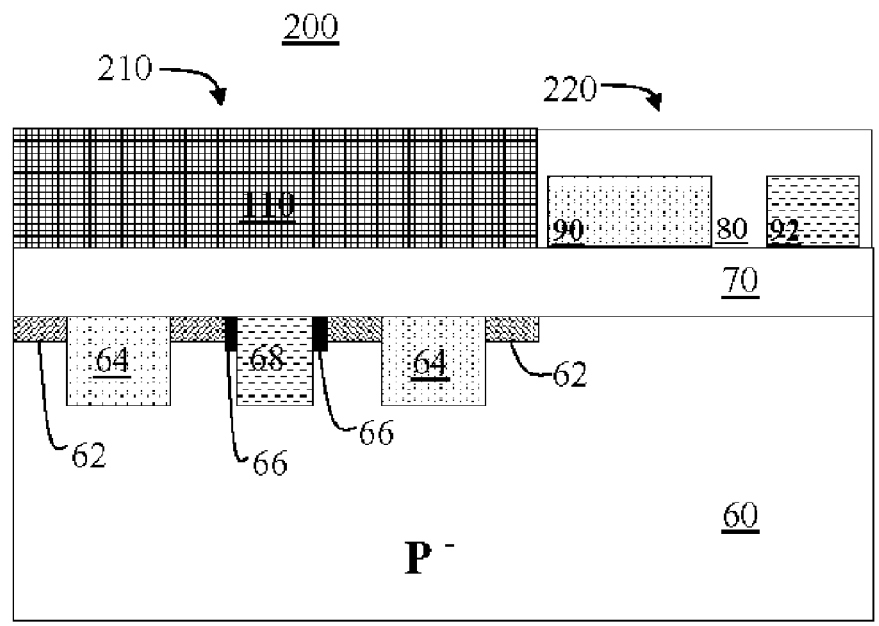
FIG. 12 is a cross-sectional view of the sensor cell of FIG. 11 after implantation of the n+ and p+ regions for Flexfet™ CMOS processing.
Figure 13:
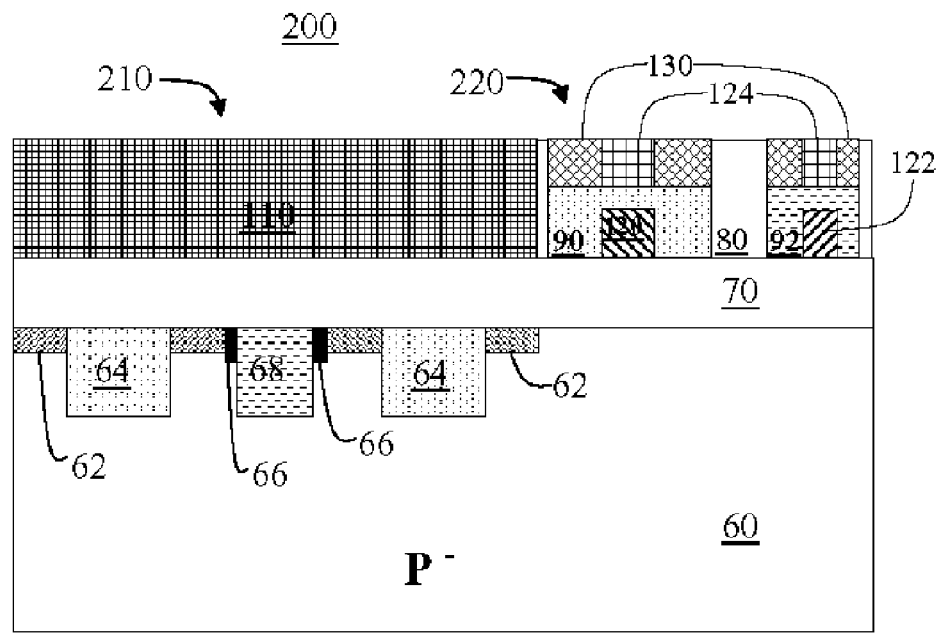
FIG. 13 is a cross-sectional view of the sensor cell of FIG. 12 following development of Flexfet™ CMOS devices within the SOI layer.

With the sensors securely insulated in the Handle Layer, the CMOS processing, step 44 in FIG. 3, may continue with a process having a low thermal budget for the fabrication of the double-gate CMOS readout circuitry 220 in the SOI layer 80. FIG. 12 shows the placement of the n+ and p+ regions, 90 and 92, respectively. The standard process continues in FIG. 13 with the formation of the readout circuitry 220 in the SOI layer 80. Since the preferred embodiment follows the standard Flexfet™ process, which has been fully described by the '169 application, it is noted here that the Flexfet™ transistors are built in trenches within the SOI layer 80 rather than on the surface. The independent gates of the FETs are shown as 120, 122 and 124 following a surface treatment of nitride 130.

Figure 14:
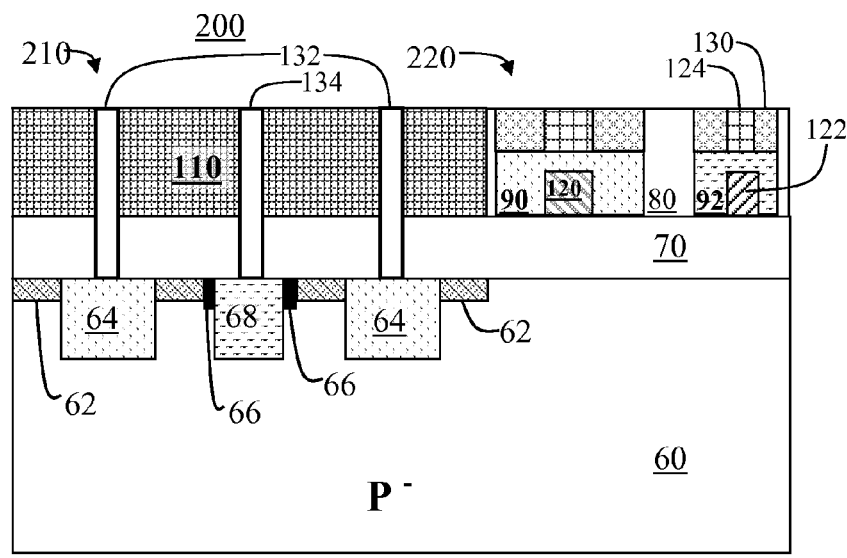
FIG. 14 is a cross-sectional view of the sensor cell of FIG. 13 after completion of the Flexfet™ CMOS process with contacts in place.
Figure 15:
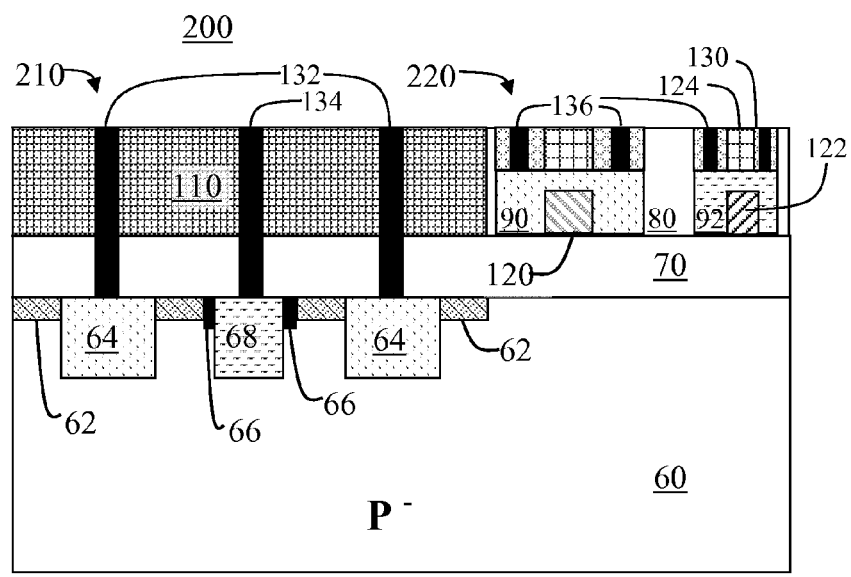
FIG. 15 is a cross-sectional view of the sensor cell of FIG. 14 after the contacts have been filled.

The standard process is once again interrupted at process step M0 (52 in FIG. 3) to mask and etch contact holes through the Window Fill 110 and BOX 70 for the formation of interconnects 132 and 134 to the cathodes 64 and anodes 68, respectively, in the handle layer 60 as shown in FIG. 14. These mask and etch steps for creating contact holes to the photodiode can occur either before or after the normal M0 mask and etch which includes formation of the terminals 136 of the transistors in the readout circuitry 220 in the SOI layer 80, as shown in FIG. 15. The contact holes 132 and 134 to the cathodes 64 and anodes 68 in the handle layer and the contact holes 136 to the CMOS transistor terminals are simultaneously filled with CVD tungsten and then planarized by CMP. With the interconnects in place in the Handle Window, the remainder of the steps of FIG. 3 are completed through the back end-of-line (BEOL, step 46 of FIG. 3) for the standard process that is being used. FIG. 15 shows the resulting structure.

The present invention has been described in a preferred embodiment that uses a photodiode detector 210 built in the handle layer 60 of an SOI wafer with readout circuitry 220 built in the device layer 80 comprising independent-double-gate FETs constructed by the Flexfet™ process. It will be noted by those having ordinary skill in the related arts that many alternate embodiments are possible without deviating from the intent of the present invention. The present discussion will now turn to some of those variations.

Although the most common starting material for the imager of the present invention is likely to be silicon, there is no intent to suggest such a limitation. In addition to Silicon, the techniques described here are readily applicable to Strained Silicon and Silicon-Germanium, without suggesting any intent to exclude other similar materials. Indeed, there is no requirement that the handle layer and the device layer be composed of similar materials as long as they are monocrystalline and can be dielectrically isolated. The materials need not even be semiconductors since the use of semi-insulators will also be recognized as falling within the scope of the present invention.

One feature of the present invention is the concept of opening a Handle Window to interconnect the detector in one layer to the readout circuitry in another while leaving the intermediate insulator intact. Methods that require etching through the insulating BOX for implanting directly into the substrate have been described by others and such techniques are not incompatible with features of the presently described invention. Furthermore, methods similar to those described here may be used to implant into the substrate through the combined SOI and BOX layers, leaving both layers intact, where material types and dimensions are not incompatible with such processing.

The concept of the Handle Window may be used to provide interconnectivity between devices in the substrate and those in the SOI layer without regard to the materials in the two opposing layers. For instance, if optimization of the readout circuitry were to call for germanium rather than silicon, that would be in keeping with the present invention. Similarly, if it is advantageous to use gallium-arsenide (GaAs) for the handle layer in order to build an optimal detector, then that is also recognized. Others have developed an SOI material comprising a silicon device layer and a GaAs handle layer separated by an oxide insulator that could be put to use within the present invention at such time as that material is commercially available. Furthermore, while the presently used material has a p-type device layer with n-type photodiodes, an n-type device layer could be used in the future with either n-type or p-type material in the handle layer.

The Handle Window, which allows the insulator layer to remain intact, protects the sensors in the handle layer while the readout circuitry is fabricated in the device layer using its own optimized process. Without this isolation the processes available for construction of the sensors are less than optimal, being limited to those that are fully compatible with the readout devices. One consequence of a mismatch in processes for the two layers is a likely shift in the thermal characteristics of the sensors, damaging them during subsequent processing of other devices. In this regard the Flexfet™ IDG-CMOS process or an equivalent low thermal budget process is essential.

Another variation that will be recognized as falling within the scope of the present invention is fabrication of the photodiode from the backside of the substrate and the readout devices from the frontside. In this configuration the Handle Window may be used for interconnection routing between the sensor and the remainder of the sensor cell, or the Handle Window may remain unused for this purpose. The photodiode may be illuminated from the frontside or the backside. Where all else is executed as described in the preferred embodiment, dynamic biasing and low-noise double-gate transistors will still provide the same advantages as in the original version.

It will be obvious to those skilled in the art that the Handle Window can be used to allow alternative devices to photodiodes to be fabricated in the handle layer with support circuitry in the isolated device layer. Such alternative devices certainly include a variety of sensors other than photodiodes, but are not limited to sensors alone. Power devices and MEMS (Micro-Electro-Mechanical Systems; or micromachines) are other candidates.

It will also be recognized that the various features employed in the preferred embodiment are neither required nor intended to be tied together to the exclusion of their use in other applications. For instance, double-gate devices can be used to improve the readout integrated circuit (ROIC) for many imagers even without use of the Handle Window. The imager, though not a monolithic cell, would be made of two different chips with photodiodes or other sensors on one chip and the ROIC on another. On the other hand, the Handle Window can be used for imager fabrication without DG-CMOS, dynamic biasing or low noise MOSFETs to make novel imagers that utilize different materials in the handle and device layers, or for imagers that simply use the feature to provide extreme isolation between the photodiode and CMOS.

While the present invention has been described with respect to a preferred embodiment, there is no implication to restrict the present invention to preclude other implementations, some of which have been briefly touched upon as well as others that will be apparent to those skilled in the related arts. It is easily recognized that the described invention may be implemented with a variety of components, and in various topologies adapted to a multitude of applications. Therefore, it is not intended that the invention be limited to the disclosed embodiments or to the specifically described details insofar as variations can be made within the spirit and scope of the appended claims.

What is claimed is:

1. A sensor cell, comprising:
   (a) a silicon substrate;
   (b) a photodiode entirely within the substrate;
   (c) an insulator layer disposed on the substrate;
   (d) a silicon-on-insulator (SOI) layer disposed on the insulator layer; and
   (e) a readout circuit to read signals from said photodiode, wherein the readout circuit comprises a multiplicity of double-gated field effect transistors (FETs) entirely within the SOI layer.

2. The sensor cell of claim 1 wherein the readout circuit comprises a double-gated FET reset switch, a double-gated FET output switch, and a double-gated FET buffer switch, and the buffer switch is connected as a source follower having a first gate in series between said photodiode and an input of the output switch to transfer a signal from said photodiode to an output bus.

3. The sensor cell of claim 2 wherein the double-gated FET buffer switch is an independently-double-gated FET having a second gate connected independent of the first gate to an externally controllable voltage source.

4. A sensor cell, comprising:
   (a) a monolithic microelectronic substrate;
   (b) a sensor entirely within the substrate;
   (c) an insulator layer disposed on the substrate;
   (d) a silicon-on-insulator (SOI) layer disposed on the insulator layer; and
   (e) a readout circuit to read signals from said sensor, wherein the readout circuit comprises a multiplicity of double-gated field effect transistors (FETs) entirely within the SOI layer.

5. The sensor cell of claim 4 wherein said sensor is a photodiode-type sensor.

6. The sensor cell of claim 4 wherein the readout circuit comprises a reset switch, a buffer switch and an output switch.

7. The sensor cell of claim 6 wherein the reset switch comprises an independently-double-gated FET having a first gate connected to an external reset control signal, and having a second gate, independent of the first gate, connected to a first bias voltage source.

8. The sensor cell of claim 6 wherein the buffer switch comprises a double-gated FET connected as a source follower having a first gate connected in series between said sensor and the output switch to transfer a signal from said sensor to the output switch.

9. The sensor cell of claim 8 wherein the buffer switch is an independently-double-gated FET having a second gate, independent of the first gate, connected to a second bias voltage source.

10. The sensor cell of claim 9 wherein the second bias voltage source biases the second gate of the buffer switch so that the buffer switch operates in a mode exhibiting low leakage current.

11. The sensor cell of claim 9 wherein the second bias voltage source biases the second gate of the buffer switch so that the buffer switch operates in a high speed operating mode.

12. The sensor cell of claim 4 wherein the insulator layer has a thickness that enables implantation through the insulator layer into the substrate.

13. An imager comprising:
   (a) a monolithic microelectronic substrate;
   (b) an insulator layer disposed on the substrate;
   (c) a silicon-on-insulator (SOI) layer disposed on the insulator layer;
   (d) a plurality of sensor cells;
   (e) drive circuitry entirely within the SOI layer for driving the sensor cells; and
   (f) selection circuitry entirely within the SOI layer, wherein the selection circuitry comprises row and column decoders for selecting one or more of the sensor cells whose signals are to be read,
   wherein each sensor cell of a plurality of sensor cells comprises:
      a sensor entirely within the substrate; and
      a readout circuit comprising double-gated field effect transistors entirely within the SOI layer to read signals from the sensor.

14. The imager of claim 13 wherein at least some of the sensors are photodiodes.

15. The imager of claim 13 wherein the readout circuit associated with each sensor cell of said plurality of sensor cells comprises a reset switch and a buffer switch.

16. The imager of claim 15 wherein the readout circuit associated with each sensor cell of said plurality of sensor cells further comprises an output switch.

17. The imager of claim 15 wherein each buffer switch comprises a double-gated field effect transistor connected as a source follower in series between the sensor of said sensor cell and the selection circuitry to transfer a signal from the sensor to an output bus when selected by the selection circuitry.

18. The imager of claim 13 wherein each sensor cell belonging to said plurality of sensor cells is isolated from each other sensor cell.

19. The imager of claim 13 wherein the drive circuitry comprises one or more bias voltage sources.

20. The imager of claim 19 wherein the one or more bias voltage sources are capable of placing one or more of said plurality of sensor cells into a low current standby mode.

* * * * *